United States Patent
Hruby et al.

(10) Patent No.: US 10,274,551 B2
(45) Date of Patent: Apr. 30, 2019

(54) MAGNETOMETER SENSOR WITH NEGATIVELY CHARGED NITROGEN-VACANCY CENTERS IN DIAMOND

(71) Applicants: IMEC VZW, Leuven (BE); Universiteit Hasselt, Hasselt (BE)

(72) Inventors: Jaroslav Hruby, Leuven (BE); Emilie Bourgeois, Hasselt (BE); Milos Nesladek, Hasselt (BE); Ward De Ceuninck, Tongeren (BE)

(73) Assignees: IMEC VZW, Leuven (BE); UNIVERSITEIT HASSELT, Hasselt (BE)

( * ) Notice: Subject to any disclaimer, the term of this patent is extended or adjusted under 35 U.S.C. 154(b) by 105 days.

(21) Appl. No.: 15/588,214

(22) Filed: May 5, 2017

(65) Prior Publication Data
US 2017/0328965 A1 Nov. 16, 2017

(30) Foreign Application Priority Data
May 12, 2016 (EP) .................................... 16169428

(51) Int. Cl.
*G01R 33/26* (2006.01)
*G01R 33/36* (2006.01)
*G01R 33/60* (2006.01)

(52) U.S. Cl.
CPC ......... *G01R 33/26* (2013.01); *G01R 33/3607* (2013.01); *G01R 33/3614* (2013.01); *G01R 33/60* (2013.01)

(58) Field of Classification Search
CPC ................ G01R 33/26; G01R 33/3607; G01R 33/3614; G01R 33/60
See application file for complete search history.

(56) References Cited

U.S. PATENT DOCUMENTS

| 8,547,090 B2 | 10/2013 | Lukin et al. |
| 9,869,731 B1 * | 1/2018 | Hovde ................. G01R 33/032 |

(Continued)

FOREIGN PATENT DOCUMENTS

| EP | 2 718 735 B1 | 2/2016 |
| WO | 2014/011286 A2 | 1/2014 |

OTHER PUBLICATIONS

Bourgeois, E. et al., "Photoelectric Detection of Electron Spin Resonance of Nitrogen-Vacancy Centres in Diamond", arXiv.org, reference 1502.07551, Feb. 2015, 7 pages.

(Continued)

*Primary Examiner* — Rodney A Bonnette
(74) *Attorney, Agent, or Firm* — McDonnell Boehnen Hulbert & Berghoff LLP

(57) ABSTRACT

The disclosure relates to a magnetometer sensor with negatively charged nitrogen-vacancy centers in diamond. One example embodiment is a magnetometer sensor. The magnetometer sensor includes a diamond crystal with one or more negatively charged nitrogen-vacancy centers. The magnetometer sensor also includes one or more light sources. Further, the magnetometer sensor includes an electrode. In addition, the magnetometer sensor includes a read-out module. The read-out module includes a read-out circuit configured to read-out a photocurrent from the electrode and a lock-in amplifier. The lock-in amplifier includes a first input, a second input, and an output. The magnetometer sensor additionally includes a microwave source configured to apply a microwave field to the negatively charged nitrogen-vacancy centers. The microwave source includes a microwave generator for generating continuous wave microwaves and a microwave modulator configured to modulate the continuous wave microwaves. Still further, the magnetometer sensor includes a processor.

20 Claims, 7 Drawing Sheets

(56) References Cited

U.S. PATENT DOCUMENTS

| | | | | |
|---|---|---|---|---|
| 2015/0192532 A1* | 7/2015 | Clevenson | ............ | G01N 24/006 324/304 |
| 2017/0370979 A1* | 12/2017 | Braje | .................... | G01R 33/323 |
| 2018/0136291 A1* | 5/2018 | Pham | ..................... | G01R 33/26 |

OTHER PUBLICATIONS

Bourgeois, E. et al., "Photoelectric Detection of Electron Spin Resonance of Nitrogen-Vacancy Centres in Diamond", Nature Communications, 6.8577, Oct. 21, 2015, pp. 1-8.

Bourgeois, E. et al., "Photoelectric Detection of Electron Spin Resonance of Nitrogen-Vacancy Centres in Diamond—Supplementary Information"; Nature Communications 6:8577, Oct. 21, 2015, pp. 1-9.

Rondin, L. et al., "Magnetometry With Nitrogen-Vacancy Defects in Diamond", Reports on Progress in Physics, vol. 77, 2014, pp. 1-26.

Horowitz, Viva R. et al., "Electron Spin Resonance of Nitrogen-Vacancy Centers in Optically Trapped Nanodiamonds", PNAS, vol. 109, No. 34, Aug. 21, 2012, p. 13493-13497.

Horowitz, Viva R. et al., "Supporting Information", PNAS, 10.1073/pnas.1211311109, pp. 1-7, Aug. 21, 2012.

Brenneis, Andreas et al., "Ultrafast Electronic Read-Out of Diamond NV Centers Coupled to Graphene", arXiv.org, reference 1408.1864; Aug. 2014, pp. 1-7.

Brenneis, Andreas et al., "Supplementary Information—Ultrafast Electronic Read-Out of Diamond NV Centers Coupled to Graphene", arXiv.org, reference 1408.1864; Aug. 2014, pp. 1-7.

Aslam, N. et al., "Photo-Induced Ionization Dynamics of the Nitrogen Vacancy Defect in Diamond Investigated by Single-Shot Charge State Detection", New Journal of Physics, vol. 15, 2013, pp. 1-17.

* cited by examiner

MAGNETOMETER SENSOR WITH NEGATIVELY CHARGED NITROGEN-VACANCY CENTERS IN DIAMOND

CROSS-REFERENCE TO RELATED APPLICATIONS

The present application is a non-provisional patent application claiming priority to European Patent Application No. EP 16169428.6, filed May 12, 2016, the contents of which are hereby incorporated by reference.

FIELD OF THE DISCLOSURE

The disclosure relates to a magnetometer sensor for sensing a magnetic field or an orientation of a magnetic field. More particularly it relates to magnetometer sensors using negatively charged nitrogen-vacancy centers in diamond.

The disclosure also relates to a method for sensing a magnetic field using an electron spin resonance technique.

BACKGROUND

Magnetometer sensors making use of negatively charged nitrogen-vacancy centers (NV$^-$) in diamond are known from patent publications U.S. Pat. No. 8,547,090 and WO 2014/011286. Those magnetometers make use of the specific spin states of NV$^-$ centers, the ground state of NV$^-$ being a triplet state whose sub-levels are split in energy into a singlet state of spin projection $m_s=0$ and a doublet $m_s=\pm 1$ and the energy separation is 2.87 GHz in absence of a magnetic field. These patent publications disclose the use of a light source (typically a green laser beam) to excite the ground state of NV$^-$ to the NV$^-$ excited state which is also a spin triplet. The excited state has a spin-dependent probability of either returning to the ground state with a red-shifted photoluminescence (PL) or decaying non-radiatively through a singlet and metastable state. Those magnetometers are read optically, by detecting emitted photons induced by electron transitions on the NV state. The excited states with spin projection $m_s=\pm 1$ have a higher probability of following the non-radiative path compared to the excited $m_s=0$ state. By applying a microwave field at resonance frequency the $m_s=\pm 1$ ground state can be favorably populated. As a result, when varying the microwave frequency over the resonance, the photoluminescence is decreased and a typical electron spin resonance spectrum (ESR) is obtained. From this photoluminescence spectrum, as discussed in the above mentioned patents, information with respect to the presence or orientation of a magnetic field can be deduced (Zeeman splitting).

Applications for detecting weak magnetic fields using magnetometers based on nitrogen-vacancy centers in diamond are numerous and are for example described by Rondin et al in "Magnetometry with nitrogen-vacancy defects in diamond", Rep. Prog. Phys. 77 (2014).

A drawback of these optically read magnetometers and methods disclosed (e.g. U.S. Pat. No. 8,547,090 and WO 2014/011286) is that they require a complex optical setup and expensive single photon detector to detect the PL light. Moreover, those optical detection systems have a poor light collection efficiency. These optical setups for reading out the PL light also results in a limited spatial resolution for detecting magnetic fields. With currently available technology and using a sophisticated optical design, the spatial resolution is still limited to about 300 nm.

With the ODMR technique the signal to noise ratio is also limited by the shot noise.

More recently, the inventors of the current patent application, announced a technique using a photocurrent measurement rather than an optical measurement to detect electron spin resonances in NV$^-$ centers. The principles of this technique were published in February 2015 on arXiv.org, reference 1502.07551 by E. Bourgeois et al., "Photoelectrical detection of electron spin resonance of nitrogen-vacancy centers in diamond". This technique, called PDMR (Photocurrent Detection of Magnetic Resonance) is based on the detection of charge carriers promoted to the conduction band of diamond by two-photon ionization of NV$^-$ centers. Using an electrode, charges are collected and a photocurrent is measured. As illustrated in FIG. 1, the intensity of photoluminescence and photocurrent were measured simultaneously while scanning the microwave frequency, in the absence and in the presence of an external magnetic field. The photocurrent I measured with the PDMR technique is expressed in nA (nano Ampere) while the measurement of the PL light using the ODMR technique is expressed as the number of photons measured per second. Similar results were published by E. Bourgeois in Nature Communications 6, 8577 (2015).

In FIG. 1, the curve 34, representing the measured photocurrent as function of microwave (MW) frequency, is a curve obtained without applying an external magnetic field while curves 35 and 36 are obtained by applying an external magnetic field along the [100] and [111] crystal direction, respectively. In this example the external magnetic field applied was 0.5 mT for the [100] direction and 2.0 mT for the [111] crystal direction. When comparing the curves 34, 35, 36 obtained with the magnetometer according to example embodiments (PDMR technique) with the curves 31, 32, 33 obtained through an optical technique (ODMR) under the same magnetic field conditions, the splitting and the minima in the curves are observed at the same frequencies for both techniques. This principle offers the possibility to read the NV spin state that can be used in quantum applications.

However, as discussed by E. Bourgeois et al. in the above mentioned publication, a major difference between the PDMR and ODMR technique is that the observed contrast value of the ESR spectrum is much lower with the PDMR technique. This is due to the photoionization of nitrogen and other defects in diamond that contribute to the photocurrent. The contrast being defined as the percentage of photocurrent reduction at the resonance frequency compared to the photocurrent off-resonance. The maximum contrast value observed for a NV ensemble by PDMR in referred publication was about 1% and with ODMR it was 10.7%. As discussed by Rondin, Rep. Prog. Phys. 77 (2014), the sensitivity of a magnetometer, defined as the minimum magnetic field detectable, is inversely proportional with the contrast value and the total counts. Hence there is room for improving the PDMR technique for use as a magnetometer sensor.

SUMMARY

Example embodiments provide a magnetometer sensor based on NV$^-$ centers in diamond that has a high detection efficiency, a high spatial resolution, a higher signal to noise ratio and an improved sensitivity for detecting low magnetic fields.

According to a first aspect, a magnetometer sensor is disclosed. This magnetometer sensor comprises a diamond crystal having one or more negatively charged nitrogen-vacancy centers (NV⁻), a light source for exciting an electron of NV⁻ to the diamond crystal conduction band, an electrode for applying an electric field to the diamond crystal, a microwave source for applying a microwave field to the negatively charged nitrogen vacancy centers and wherein the microwave source comprises a microwave generator for generating continuous wave CW microwaves having a base frequency $f_{MW}$. The magnetometer sensor further comprises a read-out module comprising a read-out circuit configured to read-out a photocurrent from the electrode and a lock-in amplifier comprising a first input for receiving the photocurrent as an input signal, a second input for providing a lock-in reference signal operating at a reference frequency and an output for providing an ESR photocurrent signal as an output signal.

The magnetometer sensor according to example embodiments is characterized in that the microwave source comprises a microwave modulator configured to modulate the continuous wave CW microwaves at a modulation frequency $f_{MOD}$ so as to generate a modulated microwave field and the magnetometer sensor is configured to generate a microwave reference trigger signal (MW-REF-T) operating at this modulation frequency $f_{MOD}$. The lock-in amplifier is configured for receiving this microwave reference trigger signal (MW-REF-T) as the reference lock-in signal for the second input of the lock-in amplifier. In this way, the reference lock-in signal of the lock-in amplifier operates at the same frequency as the modulation frequency $f_{MOD}$ of the microwaves.

The magnetometer sensor according to example embodiments further comprises a processor configured for controlling the microwave source for generating the modulated microwave field and for acquiring the ESR photocurrent signal from the lock-in amplifier.

In some embodiments, the detected ESR photocurrent signal only relates to electron transitions induced by the spin transitions at the microwave (MW) field resonance frequency. Indeed, by modulating the microwaves at a frequency $f_{MOD}$ and using the lock-in technique with a reference signal at the same frequency $f_{MOD}$, photocurrent not related to the spin transitions at the resonance frequency will be suppressed. In contrast, in the general photoelectrical spin resonance detection principle as outlined in the Ref. Bourgeois at al, the light source, i.e. the laser beam, was chopped and the lock-in reference signal was operating at this laser chopping frequency. The purpose of chopping the light source, which is the source for inducing a photocurrent, was to improve the signal to noise ratio of the photocurrent to be measured. This however implies that the detected photocurrent in the prior art magnetometer sensor is a sum of the electrical current induced by the photoionization of nitrogen impurity or eventually other defects present in diamond.

In some embodiments, the detected magnetic resonance (MR) contrast is significantly enhanced. Indeed, with the magnetometer according to example embodiments, using the MW reference trigger (MW-REF-T) instead of the light source reference trigger, the parasitic photocurrent related to defects is subtracted leading to this significant enhancement in the detected MR contrast.

As discussed by Rondin et al, the sensitivity for sensing low magnetic fields is proportional with this contrast value and hence sensitivity is strongly improved.

In some embodiments, by using a photo electrical read-out instead of an optical read-out, the signal detection efficiency of the device is significantly enhanced. This is due to the so-called photoelectrical gain factor γ, defined as the number of charges collected at the electrode for each photo-generated charge carrier. The photoelectrical gain factor γ depends on the ratio of the recombination lifetime and the transport time for electrical charge being displaced between the electrodes. In case of photoelectric detection the sensitivity is enhanced by the square root of the γ gain factor. For a gain of for example $1 \times 10^6$ this results in an enhancement of sensitivity of a factor $1 \times 10^3$.

In some embodiments using the photoelectrical detection scheme, the detection efficiency is determined by the quantum yield that can be close to 100%. This further enhances the magnetometer sensitivity. In contrast, in the optical magnetometer scheme, the detection efficiency for emitted photons is determined by the confocal optics, that is limited by several factors including high refraction index of diamond.

In some embodiments using the photoelectrical detection scheme, the noise detection may be strongly reduced. Due to the photoelectric principle, the noise is reduced by anti-correlating movement of individual electrons during the transport in the device. Further, by applying the MW reference trigger (MW-REF-T) to the lock-in amplifier according to example embodiments, the noise is further reduced and this can lead to a total reduction of the noise as low as $1 \times 10^6$ times. In other words, with example embodiments, an ESR photocurrent signal is obtained with a signal to noise ratio that is strongly improved compared to alternate detection schemes. In the case of ODMR, the optical shot noise determines the ultimate limit of the detection as listed in the Ref. Rondin et al in "Magnetometry with nitrogen-vacancy defects in diamond", Rep. Prog. Phys. 77 (2014).

In some embodiments, the components of the magnetometer sensor can be mounted on a circuit board so as to obtain a compact device. The diamond crystal can for example be a single diamond chip or an array of diamond chips mounted on the circuit board. Such a diamond chip can for example have a wafer size of 3×3×0.1 mm.

According to example embodiments, the modulation of the microwave field can be either an amplitude modulation (AM) or a frequency modulation (FM).

In some embodiments, the microwave field is modulated at a modulation frequency $f_{MOD}$ that has a value between 1 Hz and 100 MHz. For example, the modulation frequency is between 1 Hz and 30 MHz.

In an embodiment, the processor 17 comprises a control algorithm configured to perform the steps of
   a) causing the microwave source to generate the modulated microwave field and to deliver a series of N modulation cycles MC(i), with i=1 to N, and N≥2,
   b) obtaining from the lock-in amplifier, the ESR photocurrent signal corresponding to the series of N modulation cycles MC(i).

In some embodiments, the processor comprises a scanning algorithm configured to perform the steps of
   a) setting the base frequency $f_{MW}$ of the microwave source to a start value,
   b) causing the microwave source to generate a modulated microwave field at the modulation frequency $f_{MOD}$,
   c) obtaining the ESR photocurrent signal from the lock-in amplifier,
   d) varying the value of the base frequency $f_{MW}$ and repeat steps b) to c) for a number of values of the base frequency $f_{MW}$.

For example, in some embodiments, a scan is obtained of the ESR photocurrent signal as function of the base frequency $f_{MW}$.

Typically, the microwave source is operable to vary the base frequency $f_{MW}$ in a range for triggering an electron spin resonance of the one or more negatively charged nitrogen-vacancy centers.

According to a second aspect of the disclosure, a method is provided for sensing a magnetic field using an electron spin resonance technique. This method comprising the steps of providing a diamond crystal comprising one or more negatively charged nitrogen-vacancy centers,
providing a microwave generator for generating a continuous wave CW microwave wave at a base microwave frequency $f_{MW}$,
modulating the continuous wave CW microwave at a modulation frequency $f_{MOD}$ so as to obtain a modulated microwave field,
applying the modulated microwave field to the negatively charged nitrogen vacancy centers,
exposing the one or more negatively charged nitrogen-vacancy centers to a light source and wherein the light source is arranged to excite an electron of a charged nitrogen-vacancy center to the diamond crystal conduction band,
applying an electric field to the diamond crystal using an electrode,
acquiring a photocurrent from the electrode and using the photocurrent as an input of a lock-in amplifier,
apply a lock-in reference signal to the lock-in amplifier wherein the lock-in reference signal operates at the modulation frequency $f_{MOD}$,
acquiring the output signal of the lock-in amplifier so as to obtain an ESR photocurrent signal.

In some embodiments, the method according to the disclosure comprises an additional step of varying the base frequency $f_{MW}$ and repeating an acquisition of the ESR photocurrent signal. In this way, an ESR spectrum, expressing an ESR photocurrent signal as function of the base microwave frequency, is obtained.

BRIEF DESCRIPTION OF THE DRAWINGS

These and further aspects will be explained in greater detail by way of example and with reference to the accompanying drawings in which.

The figures are not drawn to scale. Generally, identical components are denoted by the same reference numerals in the figures.

DETAILED DESCRIPTION

Figure 1:
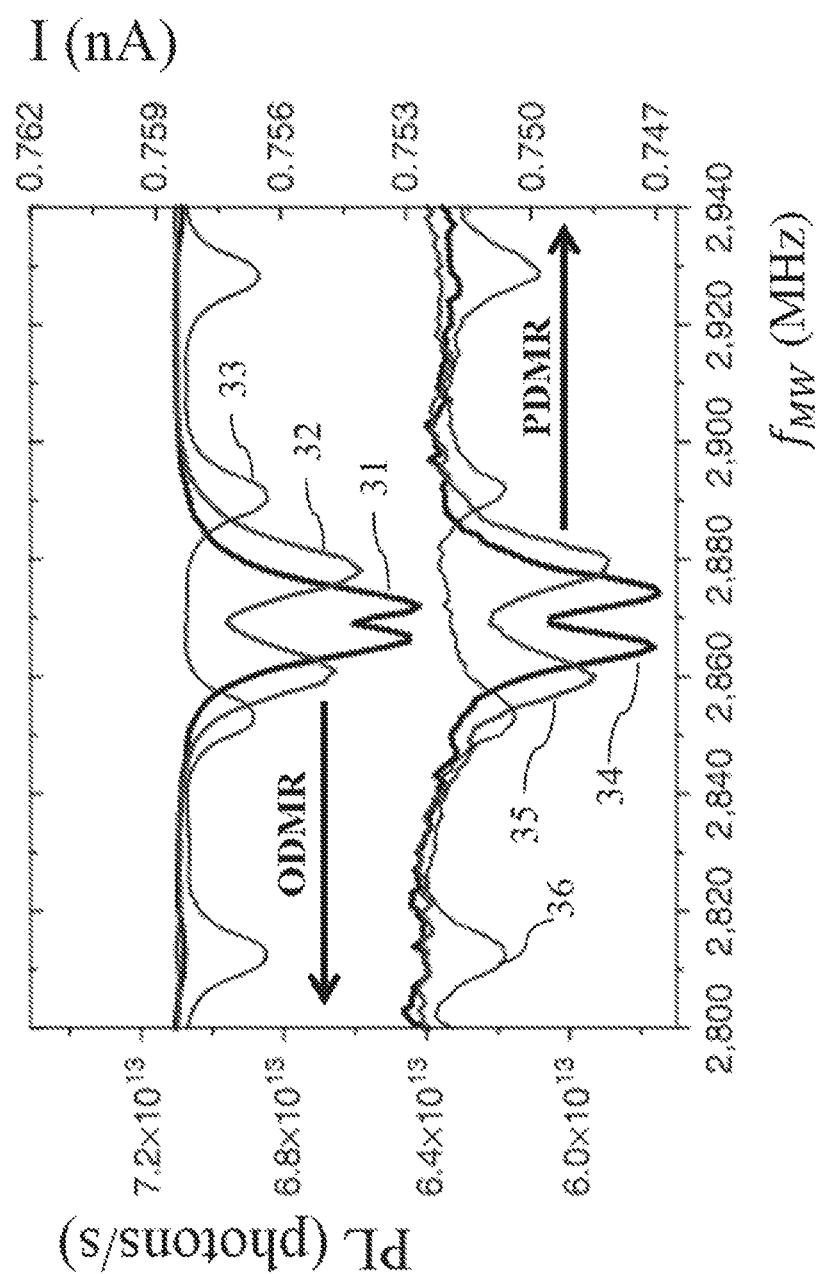
FIG. 1 shows a comparison between electron spin resonance measurements performed with an optical magnetometer (ODMR) and a magnetometer based on a photocurrent detection (PDMR), according to the prior art.

The present disclosure will be described with respect to particular embodiments and with reference to certain drawings but the disclosure is not limited thereto. The drawings described are only schematic and are non-limiting.

In the drawings, the size of some of the elements may be exaggerated and not drawn on scale for illustrative purposes. The dimensions and the relative dimensions do not necessarily correspond to actual reductions to practice of the disclosure.

It is to be noticed that the term "comprising", used in the claims, should not be interpreted as being restricted to the features listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising features A and B" should not be limited to devices consisting only of components A and B. It means that with respect to the present disclosure, the only relevant components of the device are A and B.

Reference numerals in the claims do not limit their protective scope.

Use of the article "a", "an" or "the" preceding an element does not exclude the presence of a plurality of such elements.

In a first aspect, example embodiments relate to a magnetometer sensor using negatively charged nitrogen-vacancy (NV⁻) centers in a diamond crystal. As described herein, a magnetometer sensor includes a device configured to acquire information indicative of a magnetic field or an orientation of a magnetic field.

Figure 2:
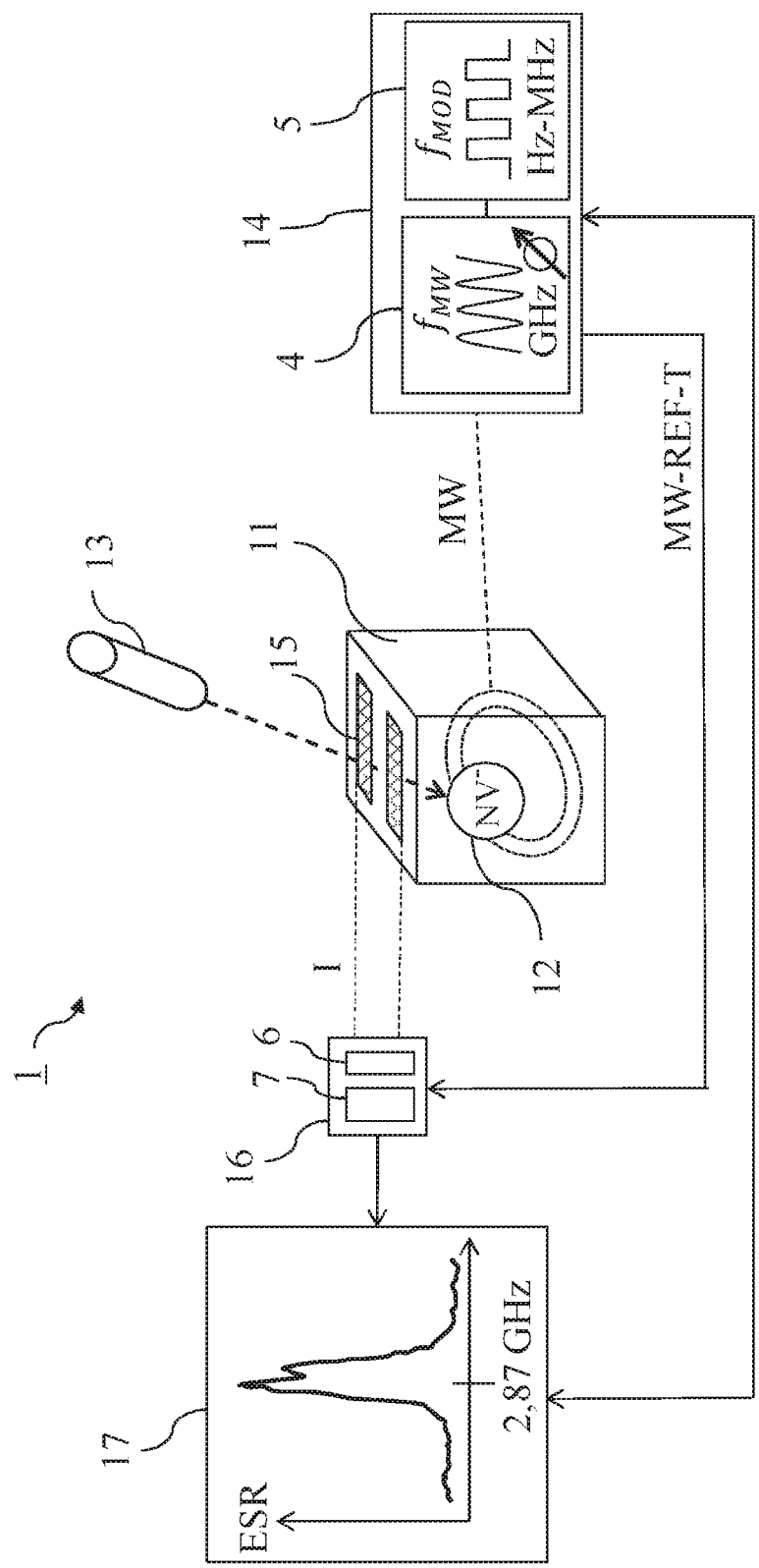
FIG. 2 shows a schematic representation of a magnetometer, according to example embodiments.

A schematic representation of an embodiment of a magnetometer sensor is shown in FIG. 2.

Such a magnetometer sensor 1 comprises a diamond crystal 11 having one or more NV⁻ centers 12 and one or more light sources 13 configured for exciting an electron of a NV⁻ center to the diamond crystal conduction band (CB). The magnetometer further comprises a microwave source 14 configured for applying a microwave field to the NV⁻ centers. This microwave source 14 comprises a microwave generator 4 for generating CW microwaves having a base frequency $f_{MW}$. The magnetometer uses an electrode 15 for applying an electric field to the diamond crystal 11 so as to collect charges from the diamond crystal. Charges collected at the electrode are read out with a readout circuit 6 forming a photocurrent. The readout circuit 6 is part of the read-out module 16.

The magnetometer sensor is characterized in that the microwave source 14 comprises a microwave modulator configured to modulate the CW (Continuous Wave) microwaves at a modulation frequency $f_{MOD}$. The modulator 5 is connected with the microwave generator 4 for modulating the CW microwaves. In this way, when in operation, the magnetometer sensor applies a modulated microwave field to the NV⁻ centers.

The read-out module 16 has to be construed as an electronic device comprising an electronic read-out circuit 6 and a lock-in amplifier 7. The read-out circuit typically comprises a pre-amplifier, for example, a low-noise current to voltage pre-amplifier well known in the art. The read-out module 16 further comprises a lock-in amplifier as discussed below.

Lock-in amplifier devices and their operation are well known in the art. Typically, a lock-in amplifier comprises a first input for receiving an input signal, a second input for providing a lock-in reference signal operating at a reference frequency and an output for providing an output signal of the lock-in amplifier. In general, a lock-in amplifier is known to single out a specific frequency component of an input signal. Typically, noise signals that obscure the signal of interest, and occur at frequencies that differ from the reference frequency are rejected by the lock-in amplifier. Typically, a lock-in amplifier comprises an electronic circuit for filtering out the signal of interest operating a frequency equal to the reference frequency. The resulting output signal of the lock-in amplifier is a signal that is proportional with the amplitude of the signal of interest that has a frequency equal to the reference frequency.

The magnetometer sensor comprises a lock-in amplifier 7 that is connected with the read-out circuit 6 and that is configured for receiving the photocurrent from the read-out circuit as an input signal. In some embodiments, the readout of the photocurrent is performed on a time scale ranging between ms (milliseconds) to fast readouts in the ns (nanosecond) range. The speed of the readout can be designed in accordance with the modulation frequency.

The magnetometer is configured to generate a microwave reference trigger signal (MW-REF-T) operating at the modulation frequency $f_{MOD}$. A reference signal operating at the modulation frequency has to be construed as a cyclic signal having a frequency equal to this modulation frequency. This reference trigger signal (MW-REF-T) operating at the microwave modulation frequency $f_{MOD}$ is for example a TTL pulse signal or a sine wave signal or any other cyclic signal operating at the modulation frequency $f_{MOD}$ that is suitable as a signal to trigger the lock-in function of the lock-in amplifier. Indeed, the lock-in amplifier is configured for receiving this microwave reference trigger signal (MW-REF-T) as the reference lock-in signal for the second input of the lock-in amplifier. In this way, the output signal of the lock-in amplifier, the ESR photocurrent signal, is a signal where parasite signal components, not related to electron transitions induced by the spin transitions at the microwave (MW) field resonance frequency, have been filtered out.

The magnetometer further comprises a processor 17 connected with the read-out module and connected with the microwave source 14 and wherein the processor 17 is configured for controlling the generation of the modulated microwave field and for acquiring the ESR photocurrent signal from the lock-in amplifier.

The magnetometer may be configured to generate a microwave reference trigger signal (MW-REF-T) operating at the modulation frequency $f_{MOD}$ using a signal generator. This signal generator can be part of the microwave source or the signal generator can be an internal generator of the lock-in amplifier. In other embodiments, the processor comprises a signal generator to provide the microwave reference trigger signal to the lock-in amplifier.

A photocurrent can be construed as an electrical current obtained from collecting the charges at the electrode while applying a light source to the diamond. The photocurrent collected at the electrode can have contributions from different physical origins as discussed above (e.g. resulting from defects in the diamond crystal).

The microwave generator 4 has to be construed as a generator that is operable in a frequency range suitable for triggering the above discussed electron spin resonance of the negatively charged nitrogen-vacancy centers. Typically, the microwave generator is operable to vary the base microwave frequency $f_{MW}$ below and above a resonance frequency of 2.87 GHz. In some embodiments, the base microwave frequency $f_{MW}$ can at least be varied in the frequency range between 2.840 and 2.900 GHz. Further, in some embodiments, the base frequency can be varied in a range between 2.80 GHz and 2.94 GHz.

The microwave modulator 5 has to be construed as a modulator suitable to modulate the amplitude or the frequency of the CW microwaves generated by the microwave generator 4.

Figure 3:
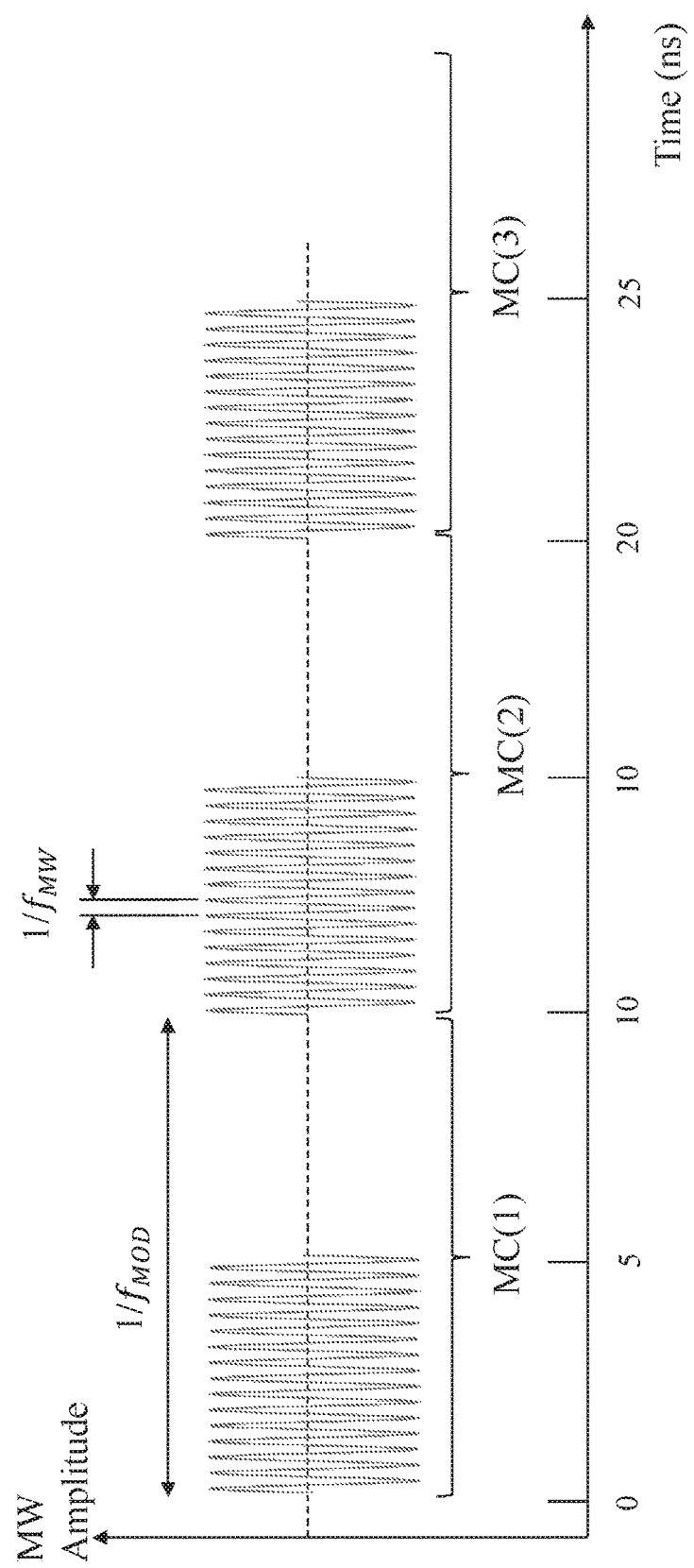
FIG. 3 shows a modulated microwave using a microwave modulator, according to example embodiments.

An example of a microwave having a base frequency $f_{MW}$ and that is modulated at a modulation frequency $f_{MOD}$ is schematically shown in FIG. 3. In this example, the modulation signal is a pulsed signal having the modulation frequency $f_{MOD}$. In FIG. 3, the microwave amplitude as function of time (expressed in nanoseconds) is presented. Three modulation cycles MC(i) with i=1 to 3 are shown. The inverse of the pulse frequency $1/f_{MOD}$ and the inverse of the microwave frequency $1/f_{MW}$ are schematically illustrated in FIG. 3 where, for example, the pulse frequency $f_{MOD}$ is set to 100 MHz and the microwave frequency is set to 2.87 GHz. The value of 100 MHz is only used here for visualization purposes of the figure.

In some embodiments, the modulation frequency $f_{MOD}$ has a value between 100 Hz and 100 MHz. For example, the modulation frequency may be selected below 30 MHz. In general, from a certain frequency value, the ESR photocurrent signal will decrease. The ESR photocurrent signal decrease depends on physical parameters such as recombination life time and electron transit time in between the electrodes of the diamond crystal. The maximum modulation frequency is determined by the spin transition rate, by which an electron with spin±1 transferred to the excited state triplet and further decays to the 0, ±1 spin manifold.

Figure 4:
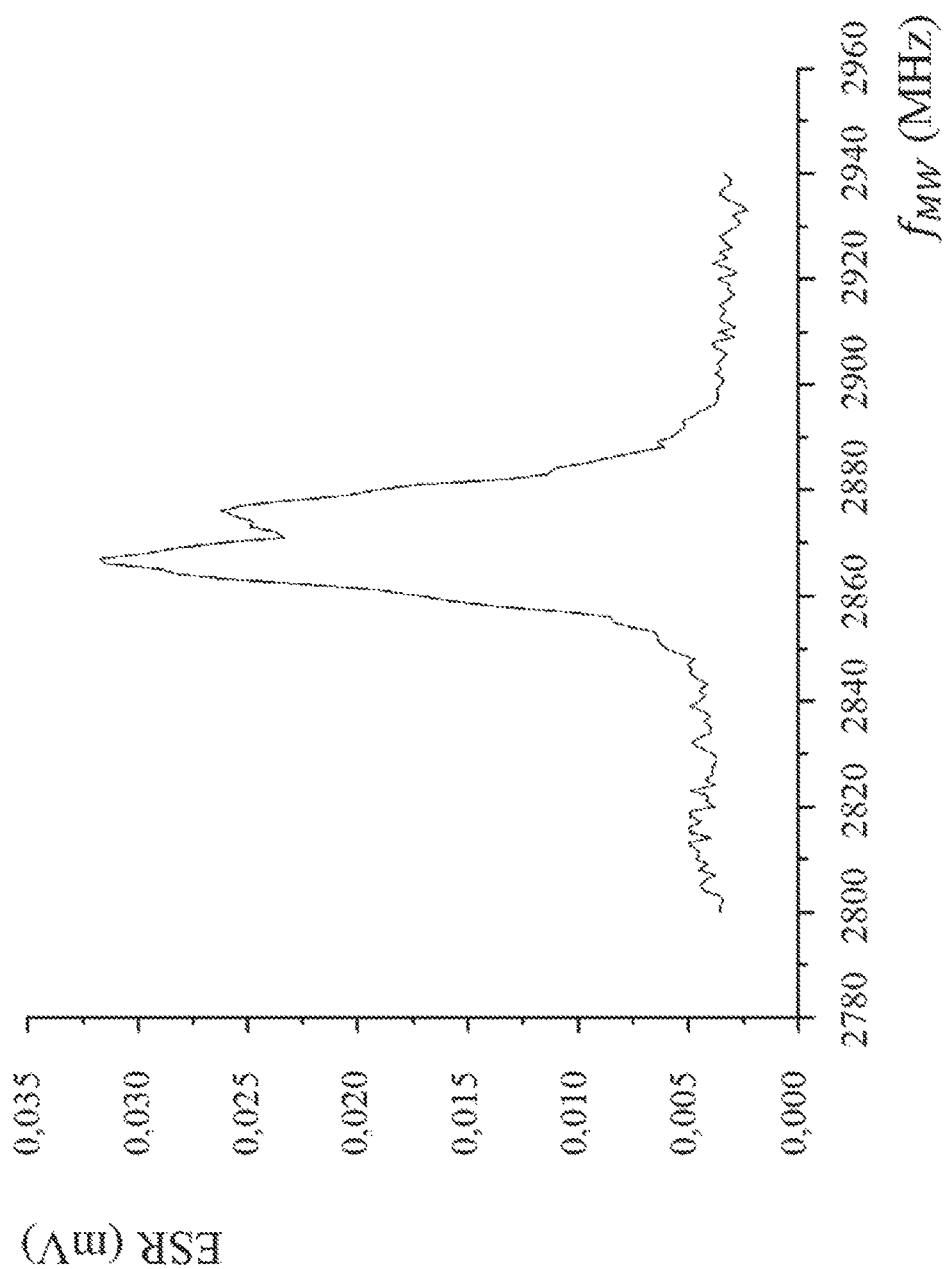
FIG. 4 shows an ESR spectrum obtained with a PDMR magnetometer, according to example embodiments.

Reference is made to FIG. 4 where a measurement of the ESR photocurrent signal as obtained with a magnetometer sensor is shown. A diamond comprising an ensemble of NV⁻ centers was used. The ESR photocurrent signal was recorded for a microwave base frequency $f_{MW}$ variation between 2.80 GHz and 2.94 GHz. The microwave modulation frequency $f_{MOD}$ was set to 133 Hz. The lock-in reference signal was a 133 Hz reference signal (MW-REF-T) from the microwave source. For this measurement, the laser power was 3.75 mW and the microwave power applied was 1 Watt. No external magnetic field was applied to perform this measurement. The ESR contrast value obtained with this measurement is about 90%. The contrast value is here defined as the percentage of the ESR photocurrent signal at the resonance frequency compared to the value off resonance.

Remark that as the microwaves are modulated and the lock-in amplifier uses the same frequency as lock-in reference signal, the ESR photocurrent output signal of the lock-in amplifier at the resonance shows a positive peak signal value. In other words, when performing a scan over the resonance to obtain an ESR spectrum, the resonances are observed as peaks (cfr FIG. 4) instead of dips (cfr FIG. 1 and FIG. 5 as discussed below).

Figure 5:
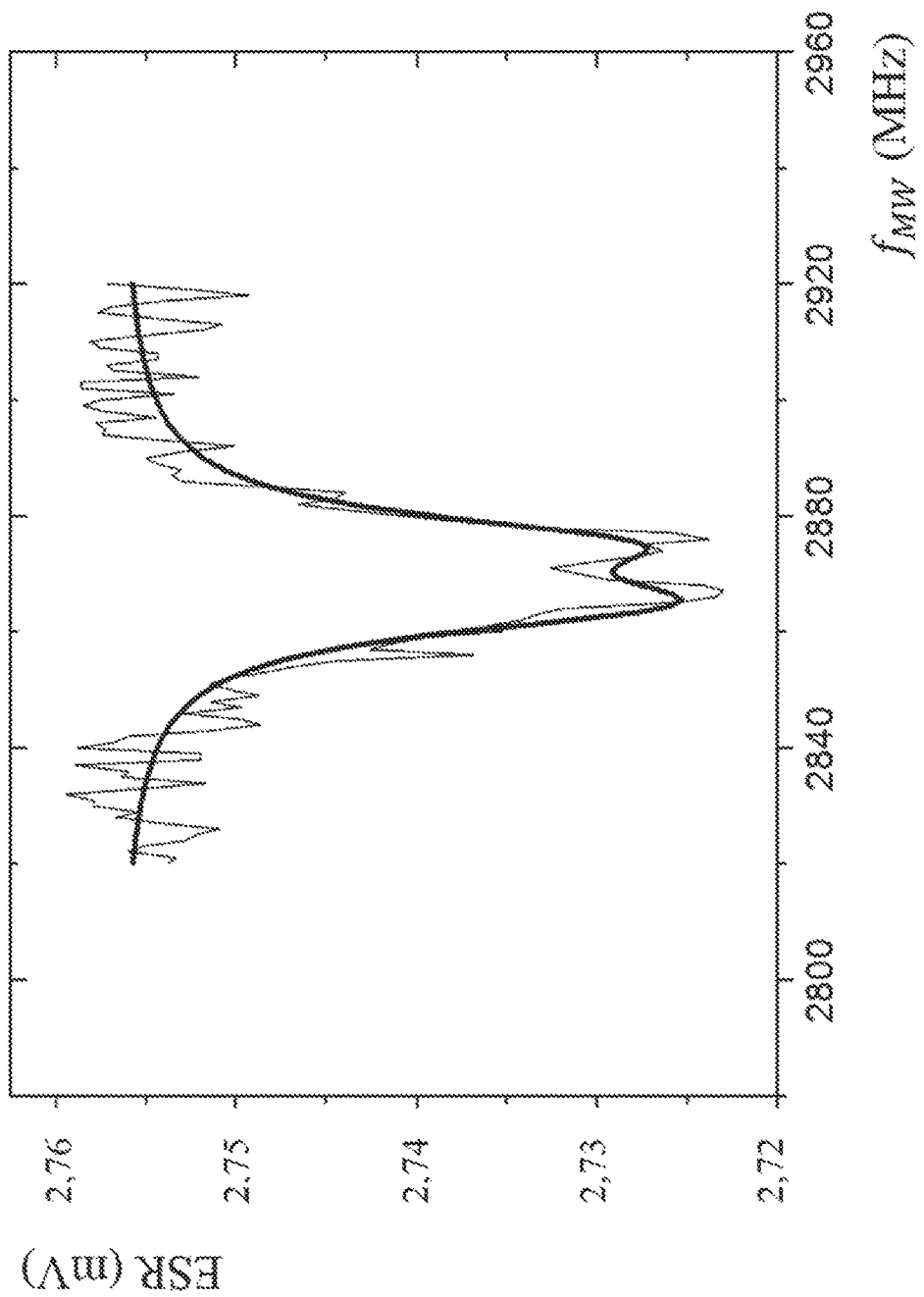
FIG. 5 shows an ESR spectrum obtained when applying CW microwaves, according to the prior art.

A second measurement of an ESR photocurrent signal, as shown on FIG. 5, was performed using a prior art magnetometer sensor where the laser light source is chopped and where the lock-in amplifier uses this light source chopping as a trigger for the lock-in reference signal. As for the measurement shown in FIG. 4, also this measurement was performed on an ensemble of NV⁻ centers. The lock-in reference signal received by the lock-in amplifier from the light source was a 133 Hz reference signal, the laser power was 3.75 mW and the microwave power applied was also 1 Watt. The difference between the two measurements of FIG. 4 and FIG. 5 is that in FIG. 4, the microwave field was modulated at 133 Hz while in FIG. 5 the lights source was modulated at 133 Hz and the microwaves were CW. The contrast value at resonance obtained with this second measurement using a prior art magnetometer sensor setup is about 1%. As mentioned above, as an ESR dip is measured instead of an ESR peak, the contrast value is here obtained by calculating the percentage difference between the ESR photocurrent signal off-resonance and the ESR photocurrent signal at the resonance frequency around 2.87 GHz.

As discussed above, the strong increase in contrast value obtained with a magnetometer sensor when compared to alternative devices is explained by the fact that the magnetometer sensor detects an ESR photocurrent signal that only relates to electron transitions induced by the spin transitions at the microwave (MW) field resonance frequency.

In some embodiments, the light source 13 of the magnetometer comprises for example a laser (e.g., a laser diode) or a light emitting diode. The light produced by the light source has a wavelength that is typically between 450 nm and 610 nm. The magnetometer can either use a light source producing a continuous wave (CW) beam or use a light source producing a pulsed beam. In alternative embodiments, the multiple light sources are used, e.g. multiple lasers or laser diodes or a combination of both type of light sources.

In some embodiments, the microwave modulator may be configured to modulate the CW microwaves using an amplitude modulating (AM) device and/or a frequency modulating (FM) device. The modulation frequency $f_{MOD}$ can be selected.

In some embodiments, the microwave modulator may be configured to modulate the CW microwaves using an amplitude modulating (AM) device that is configured to pulse the CW microwaves at a pulse frequency equal to $f_{MOD}$.

In some embodiments where a frequency modulation device is used, the frequency is modulated within a given microwave bandwidth. The bandwidth can be determined by performing a number of ESR photocurrent signal measurements at different bandwidth to determine a bandwidth value for obtaining an optimized contrast. The physical origin of contrast improvement obtained with frequency modulated microwaves or with amplitude modulated microwaves is the same.

In an embodiment, the microwave source 14 comprises an insulated metal wire pressed across the diamond surface for transmitting the electro-magnetic microwave field to the diamond. In other embodiments, an omega shaped antenna can be located below the diamond to transmit the microwave field to the diamond crystal.

According to an embodiment illustrated on FIG. 2, the electrode 15 is located on a surface of the diamond crystal 11. The electrode can for example be obtained by applying a lithography process on a surface of the diamond crystal. The applied electric field to the diamond is a DC electrical field. For example, an electrical field as low as $1.3 \times 10^2$ V $cm^{-1}$ can be applied, corresponding to a local electric field of $3.3 \times 10^2$ V $cm^{-1}$ in diamond.

In some embodiments, the contacts of the electrodes are electron (hole) blocking or electron (hole) injecting. The contacts are for example constructed from metal or obtained by doping diamond with acceptor or donor impurities.

The processor 17 has to be construed as a microprocessor or a microcontroller configured to communicate with the read-out module 16 for receiving the measured ESR photocurrent signal and to send control commands to the microwave source.

In an embodiment, the processor 17 is configured to acquire the ESR photocurrent signal during a number of subsequent modulation cycles MC(i) with i=1 to N and N≥2.

For example during 3 or more cycles. Therefore, the processor comprises a control algorithm configured to cause the microwave source 14 to generate the modulated microwave field for a series of N modulation cycles MC(i) and to obtain the ESR photocurrent signal corresponding to the delivery of the series of N modulation cycles MC(i).

In other embodiments, the processor 17 comprises a scanning algorithm configured to perform the steps of
a) setting the base frequency $f_{MW}$ of the microwave source to a start value,
b) causing the microwave source to generate a modulated microwave field at the modulation frequency $f_{MOD}$,
c) obtaining the ESR photocurrent signal from the lock-in amplifier,
d) varying the value of the base frequency $f_{MW}$ and repeat steps b) to c) for a number of scan values of the base frequency $f_{MW}$ so as to obtain a scan of the ESR photocurrent signal as function of the base frequency $f_{MW}$.

In this way, an ESR spectrum is generated in an automated way.

In one embodiment, an external computer communicates with the processor to obtain the ESR photocurrent signal and the further processing and analysis of the data is done by this external computer.

Some further elements of the magnetometer are discussed and the connections between various components of the magnetometer are addressed.

Figure 6:
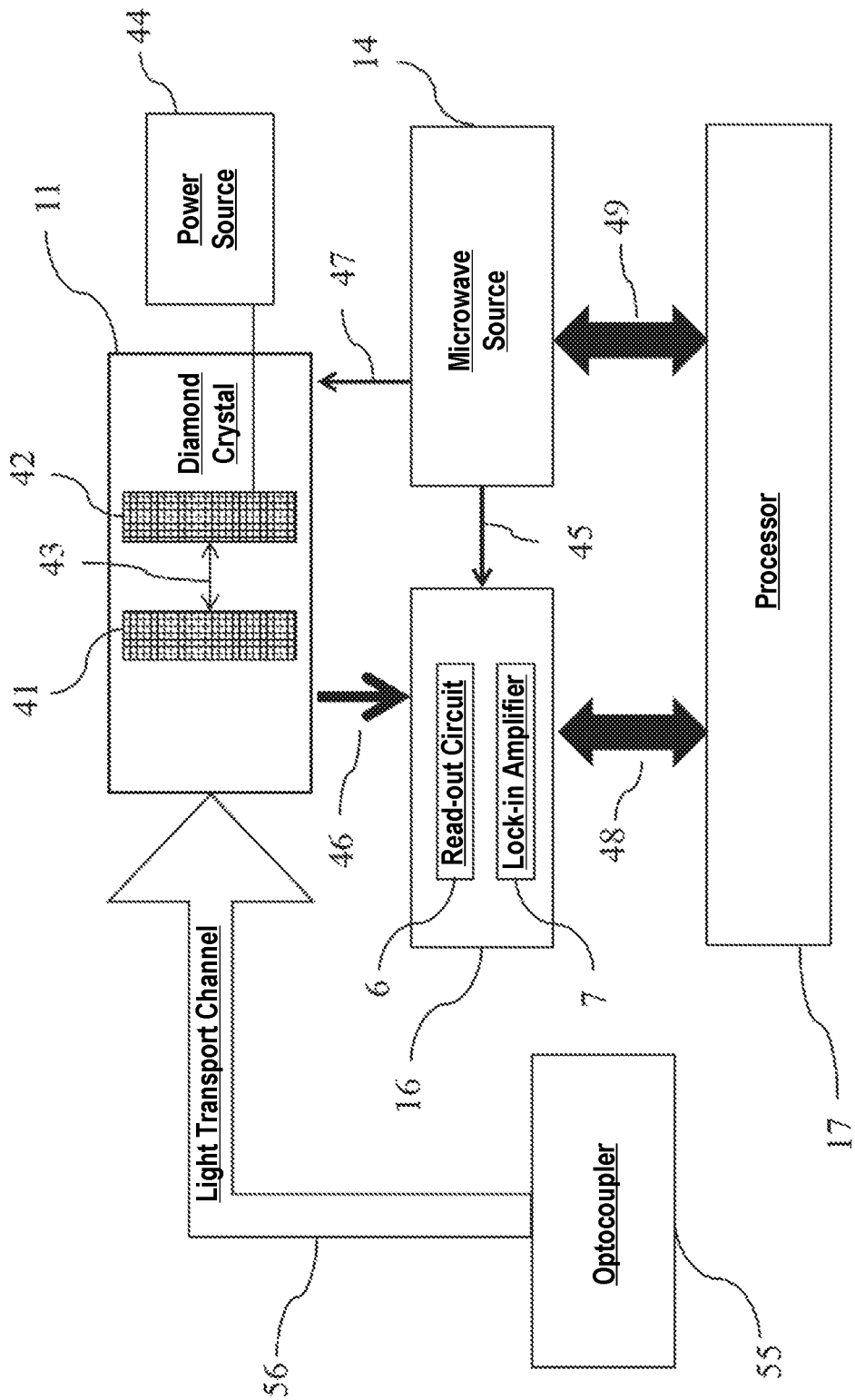
FIG. 6 shows another schematic representation of a magnetometer, according to example embodiments.

In some embodiments, as schematically illustrated in FIG. 6, the electrode located on the diamond 11 will typically have a first element 41 and a second element 42 wherein the first and the second element are separated by an inter-electrode gap 43. In some embodiments, this inter-electrode gap can have a value between 10 micrometer and 200 micrometer.

A power source 44 is connected to the electrode to generate an electric field between the first and second element of the electrode. The electrode has an electrical connection 46 with the read-out module 16. As discussed above, the read-out module 16 acquires through a read-out circuit 6 the charges collected at the electrode and pre-amplifies the signal to obtain a photocurrent signal. The lock-in amplifier 7 outputs the ESR photocurrent signal. The ESR photocurrent signal is transmitted through a connection line 48 to the processor 17. A microwave source 14 comprising a microwave generator and a modulator device is configured for sending modulated microwaves to the diamond using for example an antenna connection 47. The processor 17 has also a connection 49 with the microwave source 14 for controlling the microwave source.

In some embodiments, the lock-in amplifier is configured to receive directly a lock-in reference signal from the microwave source 14 through a communication channel 45, as shown on FIG. 6. In alternative embodiments, the lock-in amplifier generates internally the lock-in reference signal at the modulation frequency $f_{MOD}$ of the microwaves or the lock-in amplifier receives the lock-in reference signal through the processor 17.

In an embodiment, the light source, e.g. a laser diode, can be mounted in a close geometry with respect to the diamond so as to directly shine the laser light on the diamond surface.

In some embodiments, the light source is configured to direct the light beam through the inter-electrode gap 43 towards the NV⁻ centers. In alternative embodiments, the laser diode can be mounted to shine the light on the surface opposite to surface where the electrode is located.

In some embodiments, the light beam can have a spot size between 0.5 micrometer and 10 micrometer.

In other embodiments, as illustrated in FIG. 6, the light source comprises a laser diode and optocoupler 55 and the laser light is transported through a light transport channel 56 or optical wave guide towards the diamond. The light transport channel 56 comprises for example an optical fiber.

Figure 7:
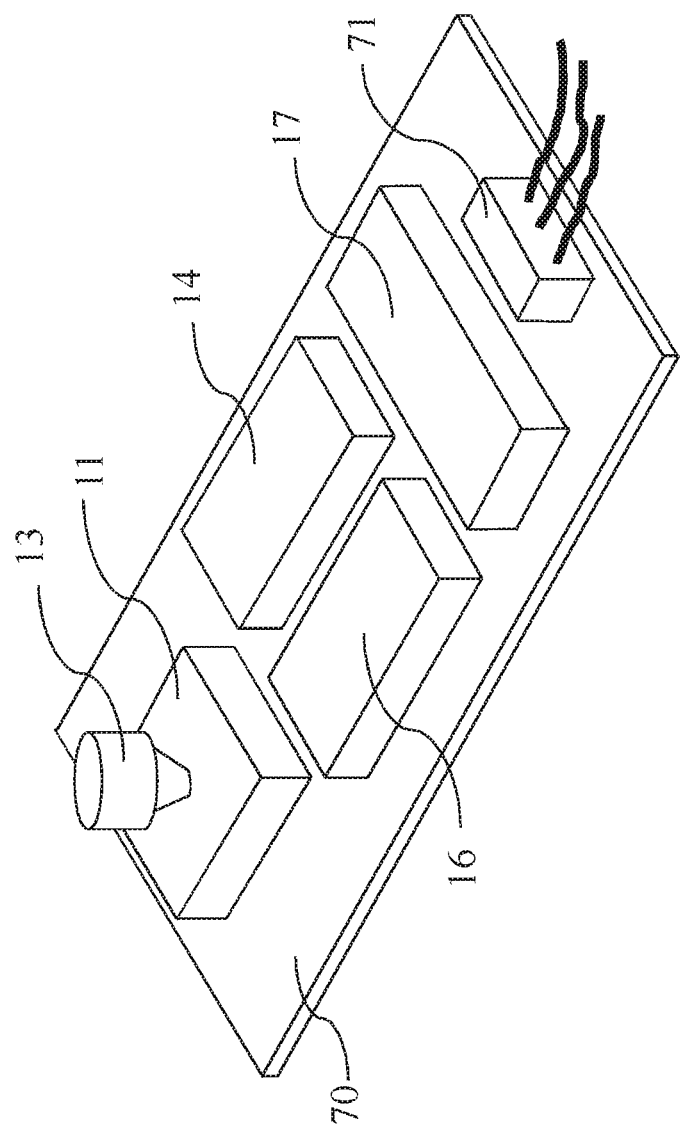
FIG. 7 shows a schematic representation of a magnetometer that is integrated on a circuit board, according to example embodiments.

In some embodiments, the magnetometer sensor can be mounted on a circuit board 70 as schematically illustrated In FIG. 7. In this example, the circuit board 70 comprises a diamond chip 11 with an electrode (not shown on FIG. 7), a read-out module 16, a microwave source 14 and a processor 17. A connector 71 is used to connect the magnetometer sensor with an external device such as for example a computer or external processor. As discussed above, a laser diode 13 can be put in close geometry to the diamond or alternatively a light transport channel can be used to transport the light from the source to the diamond. In this way, a compact PDMR magnetometer mounted on a circuit board is obtained. Remark that with ODMR type magnetometers such a compact device cannot be built due to the complexity of PL detector geometry and measurement.

In some embodiments, the diamond is for example a single crystal type-Ib or type-IIa. Techniques for preparing diamonds with NV⁻ centers are known in the art. For example, electron irradiation can be performed on a high-pressure high-temperature type-Ib single-crystal diamond (with dimensions of for example 2.9×2.9×0.5 mm$^3$, plate from Element Six) having an initial concentration of neutral nitrogen-vacancy (NV⁰) centers of about 200 ppm. In another example, electron irradiation can be performed on a chemical vapor deposited optical grade type-IIa single-crystal diamond (with dimensions of for example 2.8×2.8×0.28 mm$^3$, plate from Element Six) having an initial concentration of NV⁰ centers below 1 ppm. Electron irradiation can for example be performed with an electron beam of 14 MeV with doses of $10^{18}$ and $10^{16}$ cm$^{-2}$ for type-Ib and type-IIa diamond, respectively.

In a second aspect of the disclosure, a method for sensing a magnetic field using an electron spin resonance technique is provided. Such a method comprises the steps of
providing a diamond crystal comprising one or more negatively charged nitrogen-vacancy centers,
providing a microwave generator for generating a continuous wave CW microwave wave at a base microwave frequency $f_{MW}$,
modulating the continuous wave CW microwave at a modulation frequency $f_{MOD}$ so as to obtain a modulated microwave field,
applying the modulated microwave field to the negatively charged nitrogen vacancy centers,
exposing the one or more negatively charged nitrogen-vacancy centers to a light source and wherein the light source is arranged to excite an electron of a charged nitrogen-vacancy center to the diamond crystal conduction band,
applying an electric field to the diamond crystal using an electrode,
acquiring a photocurrent from the electrode and using the photocurrent as an input of a lock-in amplifier, apply a lock-in reference signal to the lock-in amplifier wherein the lock-in reference signal operates at the modulation frequency $f_{MOD}$,
acquiring the output signal of the lock-in amplifier so as to obtain an ESR photocurrent signal.

In some embodiments, the acquisition of the ESR photocurrent signal is performed during a number of subsequent modulation cycles. For example during three or more cycles.

Alternatively, the method further comprises a step of
varying the base frequency $f_{MW}$ and repeating an acquisition of the ESR photocurrent signal.

In this way, by measuring the ESR photocurrent signal as function of the base microwave frequency, an ESR spectrum can be obtained based.

In some embodiments, the photocurrent is acquired by operating in a secondary photocurrent mode. In this mode, a signal amplification by photoelectric gain can be provided (gain factor up to $10^8$).

In alternative embodiments, the photocurrent is acquired by operating in a reverse electrical carrier blocking mode. In this mode, high-speed operation of the magnetometer sensor can be provided (up to 100 MHz).

Further Embodiments are herein described:
In an example embodiment, there is a magnetometer sensor (1) comprising
a diamond crystal (11) comprising one or more negatively charged nitrogen-vacancy centers (12),
one or more light sources (13) directed toward the diamond crystal (11) and configured for exciting an electron of the charged nitrogen-vacancy center (12) to the diamond crystal conduction band,
an electrode assembly (15) for applying an electric field to the diamond crystal (11) and configured for acquiring a photocurrent (I) induced in the diamond crystal conduction band by the one or more light sources (13),
a read-out module (16) comprising
a read-out circuit (6) configured to read-out the photocurrent (I) from the electrode assembly (15), and
a lock-in amplifier (7) comprising a first input for receiving the photocurrent (I) as an input signal, a second input for receiving a lock-in reference signal operating at a reference frequency and an output for providing an electron spin resonance photocurrent signal as an output signal,
a microwave source (14) configured for applying a microwave electromagnetic field to the negatively charged nitrogen vacancy centers (12), wherein the microwave source (14) comprises a microwave generator (4) for generating continuous wave (CW) microwaves having a base frequency $f_{MW}$,
wherein the microwave source (14) further comprises a microwave modulator (5) configured for modulating the continuous wave (CW) microwaves at a modulation frequency $f_{MOD}$ so as to generate a modulated microwave electromagnetic field,
wherein the magnetometer sensor (1) comprises a signal generator for generating a microwave reference trigger signal (MW-REF-T) operating at the modulation frequency $f_{MOD}$,
wherein the lock-in amplifier (7) is configured for receiving the microwave reference trigger signal (MW-REF-T) as the reference lock-in signal for the second input, and
wherein the magnetometer sensor (1) further comprises a processor (17) configured for controlling the microwave source (14) and for acquiring the electron spin resonance photocurrent signal from the lock-in amplifier (7).

In an alternative embodiment, the microwave modulator (5) comprises an amplitude modulating (AM) device or a frequency modulating (FM) device.

In an alternative embodiment the amplitude modulating (AM) device is configured to pulse the CW microwaves at a pulse frequency equal to $f_{MOD}$.

In an example embodiment, the processor (17) comprises a control algorithm configured to perform the steps of
 a) causing the microwave source to generate the modulated microwave field and to deliver a series of N modulation cycles MC(i), with i=1 to N, and N≥2, and
 b) obtaining from the lock-in amplifier, the electron spin resonance photocurrent signal corresponding to the series of N modulation cycles MC(i)
or alternatively, the processor (17) comprises a scanning algorithm configured to perform the steps of
 a) setting the base frequency $f_{MW}$ of the microwave source (14) to a start value,
 b) causing the microwave source (14) to generate a modulated microwave field at the modulation frequency $f_{MOD}$,
 c) obtaining the electron spin resonance photocurrent output signal from the lock-in amplifier (7),
 d) varying the value of the base frequency $f_{MW}$ and repeat steps b) to c) for a number of values of the base frequency $f_{MW}$ so as to obtain a scan of the electron spin resonance photocurrent signal as function of the base frequency $f_{MW}$.

In another embodiment, the microwave source is operable to vary the base microwave frequency $f_{MW}$ at least in a range between 2.840 and 2.900 GHz.

In an alternative embodiment of the magnetometer sensor the one or more light sources comprises one or more lasers or one or more laser diodes for producing a light beam having a wavelength between 450 nm and 610 nm.

In an alternative embodiment of the circuit board (70) comprising a magnetometer sensor the diamond crystal (11) is a single diamond chip.

In another example embodiment, the method for sensing a magnetic field using a magnetometer sensor (1) comprises the steps of
 generating a continuous wave (CW) microwave field at a base microwave frequency $f_{MW}$,
 modulating the continuous wave (CW) microwave field at a modulation frequency $f_{MOD}$ so as to obtain a modulated microwave field,
 applying the modulated microwave field to the negatively charged nitrogen vacancy centers,
 exposing the one or more negatively charged nitrogen-vacancy centers to the one or more light sources to excite an electron of a charged nitrogen-vacancy¬ center to the diamond crystal conduction band,
 applying an electric field to the diamond crystal,
 reading the photocurrent (I) from the electrode assembly and using the photocurrent as an input for the lock-in amplifier,
 applying a lock-in reference signal to the lock-in amplifier wherein the lock-in reference signal operates at the modulation frequency $f_{MOD}$,
 acquiring the output signal of the lock-in amplifier so as to obtain an electron spin resonance photocurrent signal.

In another embodiment, the method for sensing a magnetic field using a magnetometer sensor (1) also comprises
 varying the base frequency $f_{MW}$ and repeating an acquisition of the electron spin resonance photocurrent signal so as to obtain an electron spin resonance spectrum.

What is claimed is:

1. A magnetometer sensor comprising:
 a diamond crystal comprising one or more negatively charged nitrogen-vacancy centers;
 one or more light sources for exciting an electron of at least one of the one or more negatively charged nitrogen-vacancy centers to the diamond crystal conduction band;
 an electrode for applying an electric field to the diamond crystal;
 a read-out module comprising:
  a read-out circuit configured to read-out a photocurrent from the electrode; and
  a lock-in amplifier comprising:
   a first input for receiving the photocurrent as an input signal;
   a second input for providing a lock-in reference signal operating at a reference frequency; and
   an output for providing an electron spin resonance photocurrent signal as an output signal;
 a microwave source configured to apply a microwave field to the negatively charged nitrogen-vacancy centers,
  wherein the microwave source comprises a microwave generator for generating continuous wave microwaves having a base frequency ($f_{MW}$),
  wherein the microwave source comprises a microwave modulator configured to modulate the continuous wave microwaves at a modulation frequency ($f_{MOD}$) so as to generate a modulated microwave field,
  wherein the magnetometer sensor is configured to generate a microwave reference trigger signal operating at the modulation frequency ($f_{MOD}$), and
  wherein the lock-in amplifier is configured to receive the microwave reference trigger signal as the lock-in reference signal; and
 a processor configured to:
  control the microwave source generating the modulated microwave field; and
  acquire the electron spin resonance photocurrent signal from the lock-in amplifier.

2. The magnetometer sensor according to claim 1, wherein the microwave modulator is configured to modulate the continuous wave microwaves using an amplitude modulating device or a frequency modulating device.

3. The magnetometer sensor according to claim 2, wherein the amplitude modulating device is configured to pulse the continuous wave microwaves at a pulse frequency equal to the modulation frequency ($f_{MOD}$).

4. The magnetometer sensor according to claim 1, wherein the modulation frequency ($f_{MOD}$) has a value between 1 Hz and 100 MHz.

5. The magnetometer sensor according to claim 1, wherein the processor comprises a control algorithm configured to perform steps comprising:
 causing the microwave source to generate the modulated microwave field and to deliver a series of N modulation cycles MC(i), with i=1 to N, and N≥2; and
 obtaining, from the lock-in amplifier, the electron spin resonance photocurrent signal corresponding to the series of N modulation cycles MC(i).

6. The magnetometer sensor according to claim 1, wherein the processor comprises a scanning algorithm configured to perform steps comprising:
 (a) setting the base frequency ($f_{MW}$) of the microwave source to a start value;
 (b) causing the microwave source to generate the modulated microwave field at the modulation frequency ($f_{MOD}$);

(c) obtaining the electron spin resonance photocurrent output signal from the lock-in amplifier; and (d) varying a value of the base frequency ($f_{MW}$) and repeat steps (b) and (c) for a number of values of the base frequency ($f_{MW}$) so as to obtain a scan of the electron spin resonance photocurrent signal as a function of the base frequency ($f_{MW}$).

7. The magnetometer sensor according to claim 1, wherein the microwave source is operable to vary the base frequency ($f_{MW}$) in a range for triggering an electron spin resonance of the one or more negatively charged nitrogen-vacancy centers.

8. The magnetometer sensor according to claim 1, wherein the one or more light sources comprise one or more lasers or one or more laser, light-emitting diodes for producing a light beam having a wavelength between 450 nm and 610 nm.

9. The magnetometer sensor according to claim 1, wherein the microwave source is operable to vary the base frequency ($f_{MW}$) at least in a range between 2.840 GHz and 2.900 GHz.

10. A circuit board comprising a magnetometer sensor, wherein the magnetometer sensor comprises:
a diamond crystal comprising one or more negatively charged nitrogen-vacancy centers;
one or more light sources for exciting an electron of at least one of the one or more negatively charged nitrogen-vacancy centers to the diamond crystal conduction band;
an electrode for applying an electric field to the diamond crystal;
a read-out module comprising:
a read-out circuit configured to read-out a photocurrent from the electrode; and
a lock-in amplifier comprising:
a first input for receiving the photocurrent as an input signal;
a second input for providing a lock-in reference signal operating at a reference frequency; and
an output for providing an electron spin resonance photocurrent signal as an output signal;
a microwave source configured to apply a microwave field to the negatively charged nitrogen-vacancy centers,
wherein the microwave source comprises a microwave generator for generating continuous wave microwaves having a base frequency ($f_{MW}$),
wherein the microwave source comprises a microwave modulator configured to modulate the continuous wave microwaves at a modulation frequency ($f_{MOD}$) so as to generate a modulated microwave field,
wherein the magnetometer sensor is configured to generate a microwave reference trigger signal operating at the modulation frequency ($f_{MOD}$), and
wherein the lock-in amplifier is configured to receive the microwave reference trigger signal as the lock-in reference signal; and
a processor configured to:
control the microwave source generating the modulated microwave field; and
acquire the electron spin resonance photocurrent signal from the lock-in amplifier,
wherein the diamond crystal is a single diamond chip or an array of diamond chips.

11. The circuit board according to claim 10, wherein the microwave modulator is configured to modulate the continuous wave microwaves using an amplitude modulating device or a frequency modulating device.

12. The circuit board according to claim 11, wherein the amplitude modulating device is configured to pulse the continuous wave microwaves at a pulse frequency equal to the modulation frequency ($f_{MOD}$).

13. The circuit board according to claim 10, wherein the modulation frequency ($f_{MOD}$) has a value between 1 Hz and 100 MHz.

14. The circuit board according to claim 10, wherein the processor comprises a control algorithm configured to perform steps comprising:
causing the microwave source to generate the modulated microwave field and to deliver a series of N modulation cycles MC(i), with i=1 to N, and N≥2; and
obtaining, from the lock-in amplifier, the electron spin resonance photocurrent signal corresponding to the series of N modulation cycles MC(i).

15. The circuit board according to claim 10, wherein the microwave source is operable to vary the base frequency ($f_{MW}$) in a range for triggering an electron spin resonance of the one or more negatively charged nitrogen-vacancy centers.

16. A method for sensing a magnetic field using an electron spin resonance technique, wherein the method comprises:
providing a diamond crystal comprising one or more negatively charged nitrogen-vacancy centers;
providing a microwave generator for generating continuous wave microwaves having a base frequency ($f_{MW}$);
modulating the continuous wave microwaves at a modulation frequency ($f_{MOD}$) so as to obtain a modulated microwave field;
applying the modulated microwave field to the negatively charged nitrogen-vacancy centers;
exposing the one or more negatively charged nitrogen-vacancy centers to a light source, wherein the light source is arranged to excite an electron of at least one of the one or more negatively charged nitrogen-vacancy centers to the diamond crystal conduction band;
applying an electric field to the diamond crystal using an electrode;
acquiring a photocurrent from the electrode and using the photocurrent as an input of a lock-in amplifier;
apply a lock-in reference signal to the lock-in amplifier, wherein the lock-in reference signal operates at the modulation frequency ($f_{MOD}$); and
acquiring an output signal of the lock-in amplifier so as to obtain an electron spin resonance photocurrent signal.

17. The method according to claim 16, further comprising:
varying the base frequency ($f_{MW}$); and
repeating an acquisition of the electron spin resonance photocurrent signal so as to obtain an electron spin resonance spectrum.

18. The method according to claim 16, wherein the modulation frequency ($f_{MOD}$) has a value between 1 Hz and 100 MHz.

19. The method according to claim 16, wherein the base frequency ($f_{MW}$) has a value in a range for triggering an electron spin resonance of the one or more negatively charged nitrogen-vacancy centers.

20. The method according to claim 16, wherein the photocurrent is acquired by operating in a secondary photocurrent mode so as to provide signal amplification by photoelectric gain or the photocurrent is acquired by operating in a reverse electrical carrier blocking mode so as to enable high-speed operation.

\* \* \* \* \*